(12) United States Patent
Chen et al.

(10) Patent No.: US 6,368,949 B1
(45) Date of Patent: Apr. 9, 2002

(54) POST-SPACER ETCH SURFACE TREATMENT FOR IMPROVED SILICIDE FORMATION

(75) Inventors: Susan H. Chen, Santa Clara; Simon S. Chan, Saratoga, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/666,342

(22) Filed: Sep. 21, 2000

Related U.S. Application Data
(60) Provisional application No. 60/155,547, filed on Sep. 24, 1999.

(51) Int. Cl.[7] .................. H01L 21/3205; H01L 21/4763
(52) U.S. Cl. ....................................... 438/592; 438/774
(58) Field of Search ................................ 438/166, 259, 438/300, 305, 585, 592, 771, 774, 906, 974, 197, 294, 303, 385, 595

(56) References Cited

U.S. PATENT DOCUMENTS

| | | | |
|---|---|---|---|
| 4,835,112 A | 5/1989 | Pfiester et al. ............... | 438/305 |
| 5,208,472 A | 5/1993 | Su et al. ...................... | 257/344 |
| 5,231,038 A * | 7/1993 | Yamaguchi et al. ........ | 438/303 |
| 5,536,684 A | 7/1996 | Dass et al. ................... | 438/535 |
| 5,691,212 A | 11/1997 | Tsai et al. .................... | 438/297 |
| 5,942,780 A * | 8/1999 | Barsan et al. ................ | 257/321 |
| 6,066,572 A * | 5/2000 | Lu et al. ...................... | 438/774 |
| 6,184,114 B1 * | 2/2001 | Lukanc ........................ | 438/585 |
| 6,239,452 B1 * | 5/2001 | Xiang et al. .................. | 257/57 |
| 6,265,272 B1 * | 7/2001 | Chen ........................... | 438/300 |

FOREIGN PATENT DOCUMENTS

JP         019823212 A1 *  1/1999

* cited by examiner

Primary Examiner—David Nelms
Assistant Examiner—Phuc T. Dang

(57) ABSTRACT

Sub-micron dimensioned, ultra-shallow junction MOS and/or CMOS transistor devices have been reduced or a minimal junction leakage are formed by a salicide process wherein carbonaceous residue on silicon substrate surfaces resulting from reactive plasma etching for sidewall spacer formation is removed prior to salicide processing. Embodiments include forming a sacrificial oxide and removing the sacrificial oxide to remove the carbonaceous residues and anneal out damage to the silicon substrate. Subsequently formed silicide regions on the source and drain regions have improved quality.

19 Claims, 2 Drawing Sheets

POST-SPACER ETCH SURFACE TREATMENT FOR IMPROVED SILICIDE FORMATION

RELATED APPLICATIONS

This application claims priority from Provisional Application Serial No. 60/155,547, filed on Sep. 24, 1999 entitled: "POST-SPACER ETCH SURFACE TREATMENT FOR IMPROVED SILICIDE FORMATION", the entire disclosure of which is hereby incorporated by reference therein.

FIELD OF THE INVENTION

The present invention relates to a method of manufacturing high-density integrated circuit semiconductor devices exhibiting reliable, adherent, low resistance, well-aligned contacts to source, drain, and gate electrode regions of active devices, such as MOS transistors formed in or on a semiconductor substrate, by utilizing self-aligned, refractory metal silicide ("salicide") processing methodology. The present invention has particular utility in manufacturing high-density integration semiconductor devices, including multi-level devices, with design rules of 0.18 μm and below, e.g., 0.15 μm and below.

BACKGROUND OF THE INVENTION

The escalating requirements for high density and performance associated with ultra-large scale integration (ULSI) devices necessitate design rules of 0.18 μm and below, such as 0.15 μm and below, with increased transistor and circuit speeds, high reliability, and increased manufacturing throughput. The reduction of design features, e.g., of source, drain, and gate regions of transistors formed in or on a common semiconductor substrate, challenges the limitations of conventional contact and interconnection technology, including conventional photolithographic, etching, and deposition techniques.

As a result of the ever-increasing demand for large-scale and ultra-small dimensioned integrated semiconductor devices, self-aligned techniques have become the preferred technology for forming such devices in view of their simplicity and capability of high-density integration. As device dimensions decrease in the deep sub-micron range, both vertically and laterally, many problems arise, especially those caused by an increase in sheet resistance of the contact areas to the source and drain regions and junction leakage as junction layer thickness decreases. To overcome this problem, the use of self-aligned, highly electrically conductive refractory metal silicides, i.e., salicides, has become commonplace in the manufacture of integrated circuit semiconductor devices comprising, e.g., MOS type transistors. Another technique employed in conjunction with refractory metal silicide technology is the use of lightly-doped source and drain extensions formed just at the edge of the gate region, while more heavily-doped source and drain regions, to which ohmic contact is to be provided, are laterally displaced away from the gate by provision of sidewall spacers on opposing sides of the gate electrode.

Salicide processing involves deposition of a metal that forms an intermetallic compound with silicon, but does not react with silicon oxides, nitrides, or oxynitrides under normal processing conditions.

Refractory metals commonly employed in salicide processing include platinum (Pt), titanium (Ti), nickel (Ni), and cobalt (Co), each of which forms very low resistivity phases with silicon (Si), e.g., $PtSi_2$, $TiSi_2$, $NiSi$, and $CoSi_2$. In practice, the refractory metal is deposited in uniform thickness over all exposed upper surface features of a Si wafer, preferably by means of physical vapor deposition (PVD) from an ultra-pure sputtering target and an ultra-high vacuum, multi-chamber DC magnetron sputtering system. In MOS transistor formation, deposition is generally performed both after gate etch and after source/drain junction formation. In a less common variant, source/drain junction formation is effected subsequent to refractory metal layer deposition via dopant diffusion through the refractory metal layer into the underlying semiconductor. In either case, after deposition, the refractory metal layer blankets the top surface of the gate electrode, typically formed of heavily-doped polysilicon, the silicon oxide, nitride, or oxynitride sidewall spacers on the opposing side surfaces of the gate electrode, the silicon oxide isolation regions formed in the silicon substrate between adjacent active device regions, and the exposed surfaces of the substrate where the source and drain regions are formed or will be subsequently formed. As a result of thermal processing, e.g., a rapid thermal annealing process (RTA) performed in an inert atmosphere, the refractory metal reacts with underlying Si to form electrically conductive silicide layer portions on the top surface of the polysilicon gate electrode and on the exposed surfaces of the substrate where source and drain regions are or will be formed. Unreacted portions of the refractory metal layer, e.g., on the silicon oxide, nitride, or oxynitride sidewall spacers and the silicon oxide isolation regions, are then removed, as by a wet etching process selective to the metal silicide portions. In some instances, e.g., with Co, a first RTA step may be performed at a relatively lower temperature in order to form first-phase CoSi which is then subjected to a second RTA step performed at a relatively high temperature to convert the first-phase CoSi to second-phase, lower resistivity $CoSi_2$.

Illustrated in FIGS. 1(A)–1(E) are steps in a typical salicide process, illustratively $CoSi_2$, for manufacturing MOS transistors and CMOS devices according to the conventional art. The term "semiconductor substrate" as employed throughout the present disclosure and claims, denotes a Si-containing wafer, e.g., a monocrystalline Si wafer, or an epitaxial Si-containing layer formed on a semiconductor substrate comprising at least one region 1 of a first conductivity type. It will be appreciated that for P-MOS transistors, region 1 is n-type and for N-MOS transistors, region 1 is p-type. It is further understood that the substrate may comprise pluralities of n- and p-type regions arrayed in a desired pattern, as, for example, in CMOS devices.

Referring more particularly to FIG. 1(A), reference numeral 1 indicates a region or portion of a Si-containing semiconductor substrate of a first conductivity type (p or n), fabricated as a MOS transistor precursor 2 for use in a salicide process scheme. Precursor 2 is processed, as by conventional techniques not described here in detail, in order to not unnecessarily obscure the primary significance of the following description. Precursor 2 comprises a plurality of, illustratively two, isolation regions 3 and 3' of a silicon oxide, e.g., shallow trench isolation (STI) regions, extending from the substrate surface 4 to a prescribed depth below the surface. A gate insulator layer 5, typically comprising a silicon oxide layer about 25–50 Å thick, is formed on substrate surface 4. Gate electrode 6, typically of heavily-doped polysilicon, is formed over a portion of silicon oxide gate insulator layer 5, and comprises opposing side surfaces 6', 6', and top surface 6". Lightly-doped, shallow depth source and drain regions 7, 8 are then implanted on either side of gate electrode 6, with the latter acting as an implantation mask. Blanket layer 9 of an insulative material, typically an oxide, nitride, or oxynitride of silicon, is then formed to cover all exposed portions of substrate surface 4 and the exposed surfaces of the various features formed thereon or therein, inter alia, the opposing side surfaces 6', 6' and top surface 6" of gate electrode 6 and the upper surface of STI regions 3, 3'. The thickness of blanket insulative layer 9 is selected so as to provide sidewall spacers 9', 9' of desired width (see below) on each of the opposing side surfaces 6', 6' of the gate electrode 6.

Referring now to FIG. 1(B), MOS precursor structure 2 is then subjected to an anisotropic etching process, as by reactive plasma etching utilizing a fluorocarbon- or fluorohydrocarbon-based plasma comprising argon (Ar) and at least one reactive gaseous species selected from $CF_4$ and $ClF_3$, for selectively removing the laterally extending portions of insulative layer 9 and underlying portions of the gate oxide layer 5, whereby sidewall spacers 9', 9' of desired width profile are formed along the opposing side surfaces 6', 6' of gate electrode 6.

Adverting to FIG. 1(C), moderately- to heavily-doped source and drain junction regions 7' and 8' of conductivity type opposite that of the substrate are then formed in substrate region 1, as by ion implantation and high temperature annealing, with sidewall spacers 9', 9' acting as implantation masks and setting the lateral displacement length of moderately- to heavily-doped regions 7' and 8' from their respective lightly doped, shallow depth source and drain extensions 7" and 8".

With reference to FIG. 1(D), in a following step, a layer 10 of a refractory metal, typically Co, Ni, or Ti, is formed, as by DC sputtering, to cover the exposed upper surfaces of precursor 2. Following refractory metal layer 10 deposition, a thermal treatment, typically rapid thermal annealing (RTA), is performed at a temperature and for a time sufficient to convert metal layer 10 to the corresponding electrically conductive metal silicide, e.g., $PtSi_2$, $CoSi_2$, NiSi, or $TiSi_2$. Since the refractory metal silicide forms only where metal layer 10 is in contact with the underlying silicon, the unreacted portions of metal layer 10 formed over the silicon oxide isolation regions 3 and 3' and silicon nitride sidewall spacers 9', 9' are selectively removed, as by a wet etch process.

Referring now to FIG. 1(E), the resulting structure is depicted after reaction and removal of unreacted metal comprises metal silicide layer portions 11 and 12, 12' respectively formed over gate electrode 6 and heavily-doped source and drain regions 7' and 8'. Further processing may include, inter alia, formation of metal contact and dielectric insulator layers. However, as is evident from FIG. 1(E), the lower surfaces of the metal silicide layer 12, 12' portions formed by the above-described methodology are rough at the silicide-silicon interfaces, disadvantageously resulting in penetration of the underlying silicon substrate 1 by the silicide. Such penetration or "spiking" of the silicon in the region below the source and drain junction regions 7' and 8', illustratively shown at 13, can cause local shorting of the junctions, thereby resulting in junction leakage. The effect of junction penetration or spiking is greatest with metals such as Co, which have relatively high silicon consumption ratios. Junction penetration or spiking can be moderated or at least minimized and improved junction integrity provided by increasing the junction depth of source and drain regions 7' and 8' or by providing a thinner refractory metal layer, thereby reducing silicon consumption during silicidation. However, neither of these alternatives is satisfactory: the former approach runs counter to the trend toward smaller device dimensions, both vertically and laterally, in order to increase transistor switching speeds, and the latter approach results in an increase in metal silicide sheet resistance attendant its decrease in thickness.

A number of techniques for reducing leakage in ultra-shallow junctions employed in MOSFET type semiconductor devices have been proposed, such as are disclosed in U.S. Pat. Nos. 4,835,112; 5,208,472; 5,536,684; and 5,691,212. Such techniques, however, materially add to process complexity and include such steps as germanium implantation to retard dopant diffusion, provision of multiple dielectrics at the edges of the gate electrode, formation of a $CoSi_2$—$TiN_x$ bi-layer followed by removal of the $TiN_x$ layer and ion implantation of the remaining $CoSi_2$ layer, and formation of an amorphous silicon layer on a silicon MOS precursor and subsequent implantation, oxidation, annealing, etc., steps.

Thus, there exists a need for a simplified methodology for forming self-aligned silicide (i.e., salicide) contacts to ultra-thin transistor source and drain regions which provide low contact sheet resistance, absence of spiking, at least minimal junction leakage, and easy comparability with conventional process flow for the manufacture of MOS-based semiconductor devices, e.g., CMOS devices. Moreover, there exists a need for an improved process for fabricating high quality, low junction leakage MOS transistor-based devices which provides increased manufacturing throughput and product yield.

SUMMARY OF THE INVENTION

These and other needs are met by embodiments of the present invention which provide a method of manufacturing a semiconductor device comprising the steps of providing a semiconductor substrate having a surface and forming a gate electrode on a portion of the semiconductor substrate surface. The gate electrode has first and second opposing side surfaces and a top surface. A blanket layer of an insulative material is formed over the exposed portions of the semiconductor substrate surface and on the first and second opposing side surfaces and the top surface of the gate electrode. By anisotropic etching, the blanket layer of insulative material is removed from the substrate surface, as well as the blanket layer of insulative material from the top surface of the gate electrode. In this manner, an insulative sidewall spacer is formed on each of the first and second opposing side surfaces of the gate electrode, and portions of the substrate surface adjacent the sidewall spacers are exposed. Sacrificial oxide is created at the semiconductor substrate surface. Sacrificial oxide contains residue on the semiconductor substrate surface resulting from the anisotropic etching of the blanket layer. The sacrificial oxide is then removed from the semiconductor substrate surface to thereby remove the residue. In certain preferred embodiments, silicide is then formed in the semiconductor substrate surface regions.

One of the advantages of the present invention is a removal of the residues, such as carbonaceous residues that are created during formation of sidewall spacers. The residues are the result of the etching of the blanket layer of insulative material, such as by use of a reactive gaseous species such as $CF_4$ or $CHB_3$. These residues passivate the source/drain areas, and damage these junctions. A silicide, such as cobalt silicide, formed on top of the damaged and contaminated source/drain areas, can uncontrollably spike the junction to the weak points of the damaged silicon. The carbonaceous residues also prevent uniform cobalt silicide formation. However, by forming a sacrificial oxide in accordance with the present invention, the residues are removed when the sacrificial oxide is removed.

In certain preferred embodiments of the invention, the sacrificial oxidation is formed at an elevated temperature, such as at about 800° C., to anneal out the damaged silicon, in addition to eliminating of the carbonaceous residue.

The earlier stated needs are also met by another embodiment of the present invention which provides a method of manufacturing a semiconductor device. This method includes the steps of forming a gate electrode on a semiconductor substrate, forming junctions in the semiconductor substrate, and forming sidewall spacers on the gate electrode. The forming of the sidewall spacers creates residue on the semiconductor substrate. A sacrificial oxide is formed on the semiconductor substrate and this sacrificial oxide is then removed with the residue.

Additional advantages and aspects of the present invention will become readily apparent to those skilled in the art from the following detailed description, wherein only the preferred embodiment of the present invention is shown and described, simply by way of illustration of the best mode contemplated for carrying out the method of the present invention. As will be described, the present invention is capable of other and different embodiments, and its several details are susceptible of modification and various obvious respects, all without departing from the spirit of the invention. Accordingly, the drawings and description are to be regarded as illustrative in nature, and not as limitative.

BRIEF DESCRIPTION OF THE DRAWINGS

The following detailed description of the embodiment of the present invention can best be understood when read in conjunction with the following drawings, in which like reference numerals are employed throughout to designate similar features.

DETAILED DESCRIPTION OF THE INVENTION

The present invention addresses and solves problems arising from manufacturing submicrondimensioned, ultra-shallow junction MOS and CMOS transistors suitable for use in high-density integration semiconductor devices, wherein, as part of the fabrication methodology, insulative sidewall spacers are formed by selective anisotropic etching of a blanket insulator layer, which sidewall spacers act as at least part of an implantation mask during formation of moderately-to-heavily-doped source/drain junction regions to which electrical contact is made by use of salicide technology. More specifically, the present invention advantageously provides a significant and substantial reduction in the amount and severity of spiking resulting from junction penetration during the salicidation reaction performed as part of the salicide processing, which spiking deleteriously affects junction quality, typically manifested as increased junction leakage current. Furthermore, the inventive methodology provides a more uniform salicide formation. The inventive methodology thus provides increased device reliability while decreasing product yield problems associated with the conventional methodology. In addition, the inventive method is fully compatible with other aspects of existing processing methodology.

Figure 1E:
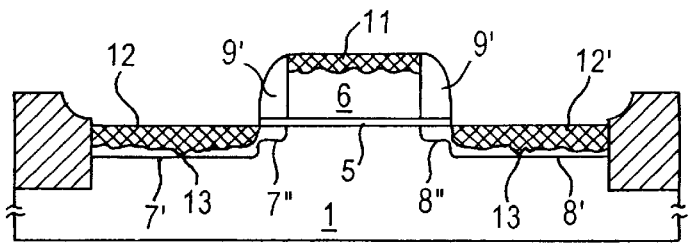
Figure 2:
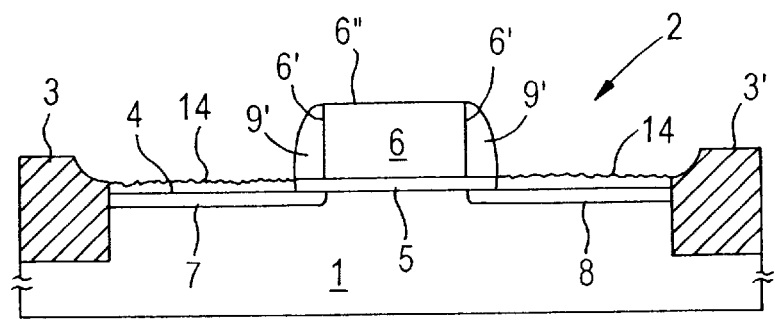
FIG. 2 illustrates, in simplified, cross-sectional schematic form, a portion of a semiconductor wafer following a spacer etch in accordance with embodiments of the present invention.

Referring now to FIG. 2, this figure represents the state of an MOS device precursor after anisotropic selective etching of the blanket insulator layer 9 typically comprised of an oxide, nitride, or oxynitride of silicon, performing insulative sidewall spacers 9', 9'. As previously indicated, such anisotropic selective etching typically comprises reactive plasma etching utilizing a flourocarbon- or flourohydrocarbon-based plasma, comprising at least one reactive, carbon-containing gaseous species, e.g., $CF_4$ and $CHF_3$. The present invention is based upon the recognition that such selective anisotropic reactive plasma etching utilizing flourocarbon- and/or flourhydrocarbon-based materials disadvantageously results in formation of a carbonaceous residue or contaminant 14 on at least the exposed portions of the substrate surface 4 overlying lightly-doped, shallow-depth source and drain region 7, 8, which residue causes uneven silicidation reaction during subsequent processing, leading to junction penetration or spiking, as illustratively indicated earlier at reference numeral 13 in FIG. 1(E).

Figure 3:
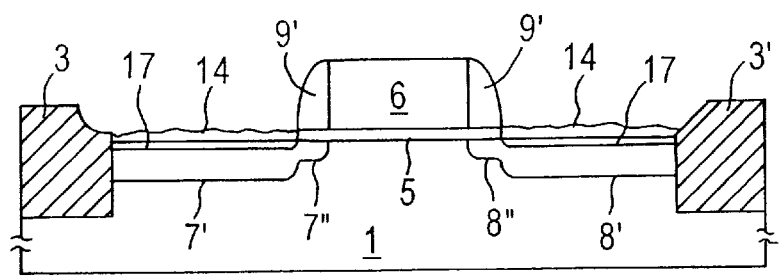
FIG. 3 illustrates, in simplified, cross-sectional schematic form, the portion of the semiconductor wafer of FIG. 2 following a sacrificial oxidation performed in accordance with embodiments of the present invention.

Following the anisotropic etching to form the sidewall spacers 9', 9', the methodology of the present invention forms a sacrificial oxide on the semiconductor substrate surface 4. This is depicted in FIG. 3 in which the sacrificial oxide is provided with reference numeral 17. In order to form the sacrificial oxide, in certain embodiments the semiconductor wafer is placed in an oxygen ($O_2$) ambient. The oxidation is performed at a temperature between about 600° C. and 900° C., and most preferably at about 800° C. One of the advantages of performing the oxidation at a relatively high temperature as provided above, is that the silicon in the substrate has been damaged during the sidewall spacer formation by the etching process is annealed out.

Figure 4:
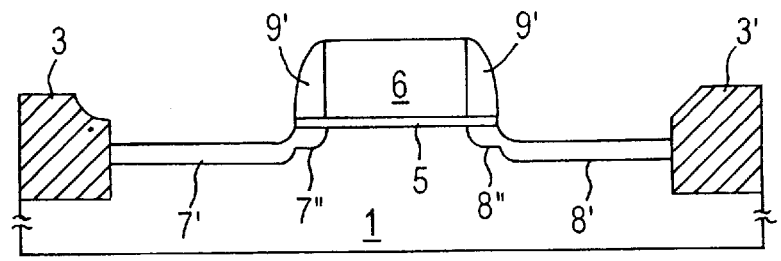
FIG. 4 illustrates, in simplified, cross-sectional schematic form, the portion of the semiconductor wafer of FIG. 3 after removal of the sacrificial oxide in accordance with embodiments of the present invention.
Figure 5:
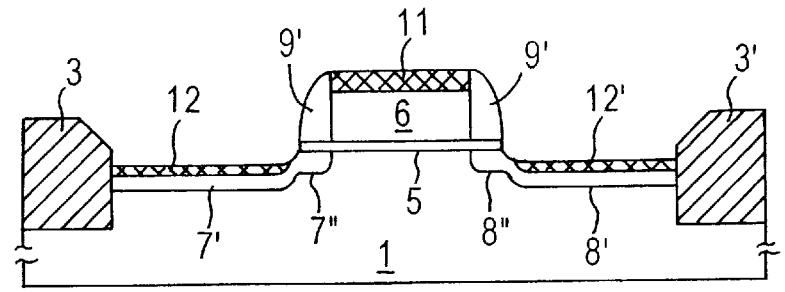
FIG. 5 illustrates, in simplified, cross-sectional schematic form, an MOS transistor comprising salicide source and drain contacts formed by the method of the present invention.

Following the formation of the sacrificial oxide, a sacrificial oxide removal step is then performed, the results of which are depicted in FIG. 4. The removal of the sacrificial oxide, using a wet etching process, employing HF as an etchant, for example, removes the sacrificial oxide 17 from the semiconductor substrate 1. As can be seen in FIG. 4, a portion of the substrate is actually removed by the removal of the sacrificial oxide 17. At the same time, however, the carbonaceous residue previously created during the etching is also removed. Furthermore, since the sacrificial oxidation process is performed at an elevated temperate of approximately 800° C. in preferred embodiments, the damage done to the silicon substrate is annealed out.

Figure 1A:
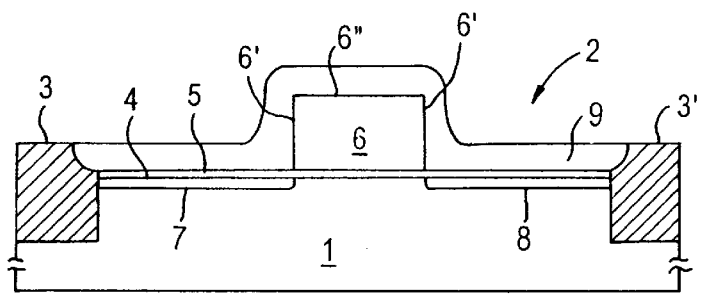
FIGS. 1(A)–1(E) illustrate, in simplified, cross-sectional schematic form, a sequence of steps performing MOS type transistors utilizing salicide technology according to conventional practices.
Figure 1B:
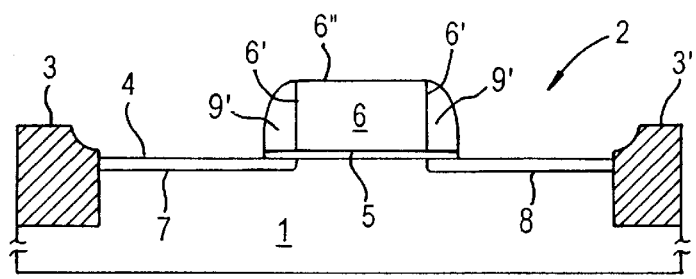
Figure 1C:
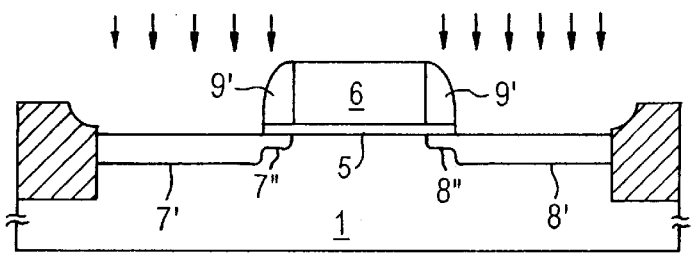
Figure 1D:
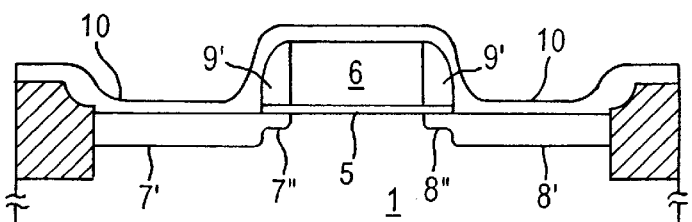

Following the removal of the sacrificial oxide 17, the surfaces of the junctions 7', 8', the subsequent salicide reaction proceeds in a conventional manner, such as already described in FIGS. 1(C)–1(E). In other words, a refractory middle layer may be deposited over the semiconductor wafer, followed by annealing steps to create silicide regions 11, 12, 12' in those locations where the middle refractory layer interfaces with a silicon or polysilicon material. Since the source and drain regions 7', 8' do not contain any residue 14 and since damage has been annealed out in the sacrificial oxidation step, a uniform silicide formation over the source and drain regions 7, 8 may be achieved. In preferred embodiments of the invention, the silicide comprises titanium silicide, cobalt silicide, nickel silicide, platinum silicide, or tungsten silicide. Junction leakage has been prevented by the elimination of spiking since the damaged silicon has been annealed and the post etch residues have been removed.

In the previous description, numerous specific details were set forth, such as specific materials, structures, reactants, processes, etc., in order to provide a better understanding of the present invention. However, the present invention can be practiced without resorting to the details specifically set forth. In other instances, well-known processing materials and techniques have not been described in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A method of manufacturing a semiconductor device, the method comprising the steps of
   providing a semiconductor substrate having a surface;
   forming a gate electrode on a portion of the semiconductor substrate surface, said gate electrode comprising first and second opposing side surfaces and a top surface;
   forming a blanket layer of an insulative material over the exposed portions of said semiconductor substrate surface and on said first and second opposing side surfaces and said top surface of said gate electrode;
   selectively removing, by anisotropically etching, (1) said blanket layer of insulative material from said semiconductor substrate surface, and (2) said blanket layer of insulative material from said top surface of said gate electrode, thereby forming an insulative sidewall spacer on each of said first and second opposing side surfaces of said gate electrode and exposing portions of said substrate surface adjacent said sidewall spacers;
   creating a sacrificial oxide at the semiconductor substrate surface, the sacrificial oxide containing residue on the semiconductor substrate surface resulting from the anisotropically etching of the blanket layer; and
   removing the sacrificial oxide from the semiconductor substrate surface to thereby remove the residue.

2. The method of claim 1, wherein the semiconductor substrate is a silicon wafer substrate.

3. The method of claim 2, wherein the step of creating a sacrificial oxide includes subjecting the semiconductor substrate surface to oxygen ambient at a temperature of between about 600° C. and about 900° C.

4. The method of claim 3, wherein the temperature is about 800° C.

5. The method of claim 4, wherein the residue comprises carbon.

6. The method of claim 5, wherein the step of removing the sacrificial oxide includes wet etching the sacrificial oxide.

7. The method of claim 5, wherein the step of removing the sacrificial oxide includes dry etching the sacrificial oxide.

8. The method of claim 1, further comprising forming silicide regions on portions of the gate electrode and the semiconductor substrate surface.

9. A method of manufacturing a semiconductor device, comprising the steps of:
   forming a gate electrode on a semiconductor substrate;
   forming junctions in the semiconductor substrate;
   forming sidewall spacers on the gate electrode by depositing a spacer layer over the gate electrode and the semiconductor substrate, and etching the spacer layer to create the sidewall spacers, the etching of the spacer layer creating residue on the semiconductor substrate;
   forming a sacrificial oxide on the semiconductor substrate; and
   removing the sacrificial oxide with the residue.

10. The method of claim 9, further comprising forming silicide on the junctions and the gate electrode.

11. The method of claim 10, wherein the silicide is one of titanium silicide, cobalt silicide, tungsten silicide, or nickel silicide.

12. The method of claim 10, wherein the step of forming a sacrificial oxide includes exposing the semiconductor substrate to an oxygen ambient.

13. The method of claim 12, wherein the step of forming a sacrificial oxide further includes subjecting the semiconductor substrate to a temperature of between about 600° C. and about 900° C. while the semiconductor substrate is exposed to the oxygen ambient.

14. The method of claim 13, wherein the temperature is about 800° C.

15. A method of manufacturing a semiconductor device, comprising the steps of:
   forming a gate electrode on a semiconductor substrate;
   forming junctions in the semiconductor substrate;
   forming sidewall spacers on the gate electrode, the forming of the sidewall spacers creating residue on the semiconductor substrate;
   forming a sacrificial oxide on the semiconductor substrate; and
   removing the sacrificial oxide with the residue wherein the step of forming a sacrificial oxide further includes subjecting the semiconductor substrate to a temperature sufficient to anneal out damage to the semiconductor substrate created during the forming of the sidewall spacers.

16. The method of claim 9, wherein the step of forming a sacrificial oxide includes exposing the semiconductor substrate to an oxygen ambient.

17. The method of claim 16, wherein the step of forming a sacrificial oxide further includes subjecting the semiconductor substrate to a temperature of between about 600° C. and about 900° C. while the semiconductor substrate is exposed to the oxygen ambient.

18. The method of claim 17, wherein the temperature is about 800° C.

19. The method of claim 18, wherein the step of forming a sacrificial oxide further includes subjecting the semiconductor substrate to a temperature sufficient to anneal out damage to the semiconductor substrate created during the forming of the sidewall spacers.

* * * * *